United States Patent
Jang et al.

(10) Patent No.: US 12,336,164 B2
(45) Date of Patent: Jun. 17, 2025

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei (CN)

(72) Inventors: Semyeong Jang, Hefei (CN); Joonsuk Moon, Hefei (CN); Deyuan Xiao, Hefei (CN); Jo-Lan Chin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 462 days.

(21) Appl. No.: 17/722,563

(22) Filed: Apr. 18, 2022

(65) Prior Publication Data
US 2023/0128761 A1     Apr. 27, 2023

Related U.S. Application Data

(63) Continuation of application No. PCT/CN2022/072992, filed on Jan. 20, 2022.

(30) Foreign Application Priority Data

Oct. 25, 2021 (CN) .......................... 202111243328.2

(51) Int. Cl.
  *H10B 12/00* (2023.01)
  *H10D 30/01* (2025.01)
  *H10D 30/67* (2025.01)
(52) U.S. Cl.
  CPC .......... *H10B 12/05* (2023.02); *H10B 12/315* (2023.02); *H10D 30/031* (2025.01); *H10D 30/6728* (2025.01)
(58) Field of Classification Search
  None
  See application file for complete search history.

(56) References Cited

U.S. PATENT DOCUMENTS

| 5,770,484 A | 6/1998 | Kleinhenz |
| 7,928,506 B2 | 4/2011 | Fujimoto |
| (Continued) | | |

FOREIGN PATENT DOCUMENTS

| CN | 104347379 A | 2/2015 |
| CN | 108198815 A | 6/2018 |
| (Continued) | | |

OTHER PUBLICATIONS

Supplementary European Search Report in the European application No. 22715511.6, mailed on Jan. 2, 2023, 8 pgs.

(Continued)

*Primary Examiner* — Michelle Mandala
(74) *Attorney, Agent, or Firm* — Kilpatrick Townsend & Stockton LLP

(57) ABSTRACT

A semiconductor structure includes: a base including bit lines arranged at intervals and semiconductor channels arranged at intervals, bit lines extending in first direction, semiconductor channels being located at part of top surfaces of bit lines, each semiconductor channel including first area, second area, and third area arranged successively in a direction perpendicular to top surfaces of bit lines; dielectric layers located between adjacent bit lines and located on side walls of semiconductor channels; gate electrodes surrounding dielectric layers in second area and extending in second direction; metal semiconductor compound layers located on top surfaces of semiconductor channels; diffusion barrier layers at least surrounding side walls of metal semiconductor compound layers; and insulating layers located between adjacent semiconductor channels on same bit line and isolating gate electrodes and diffusion barrier layers on each dielectric layer from gate electrodes and diffusion barrier layers on dielectric layers adjacent to each dielectric layer.

20 Claims, 21 Drawing Sheets

(56) References Cited

U.S. PATENT DOCUMENTS

| | | | |
|---|---|---|---|
| 8,395,139 B1 | 3/2013 | Ho | |
| 8,896,059 B1 | 11/2014 | Kim | |
| 10,903,122 B2 * | 1/2021 | Ramaswamy | H01L 28/90 |
| 11,063,054 B2 * | 7/2021 | Chavan | H10B 53/20 |
| 2009/0194813 A1 | 8/2009 | Fujimoto | |
| 2013/0323920 A1 | 12/2013 | Chang | |
| 2014/0001527 A1 | 1/2014 | Myung | |
| 2016/0035788 A1 | 2/2016 | Kim et al. | |
| 2019/0013328 A1 * | 1/2019 | Kim | H01L 24/29 |

FOREIGN PATENT DOCUMENTS

| | | |
|---|---|---|
| CN | 113035776 A | 6/2021 |
| JP | 2007329480 A | 12/2007 |
| JP | 2011097001 A | 5/2011 |
| JP | 2012038994 A | 2/2012 |
| JP | 2013026382 A | 2/2013 |

OTHER PUBLICATIONS

First Office Action of the Japanese application No. 2022-539197, issued on Dec. 19, 2023, 12 pages with English translation.

\* cited by examiner

SEMICONDUCTOR STRUCTURE AND METHOD FOR MANUFACTURING SEMICONDUCTOR STRUCTURE

CROSS-REFERENCE TO RELATED APPLICATIONS

This application is a continuation application of International Patent Application No. PCT/CN2022/072992, filed on Jan. 20, 2022, which is filed based upon and claims priority to Chinese patent application No. 202111243328.2, filed on Oct. 25, 2021. The contents of International Patent Application No. PCT/CN2022/072992 and Chinese Patent Application No. 202111243328.2 are hereby incorporated by reference in their entireties.

TECHNICAL FIELD

Embodiments of the disclosure relate to the technical field of semiconductors, and in particular, to a semiconductor structure and a method for manufacturing the semiconductor structure.

BACKGROUND

With the development of the integration density of dynamic memories in a higher direction, it is also necessary to improve the electrical performance of a functional device with a small dimension while studying the arrangement mode of transistors in a dynamic memory array structure and how to reduce the dimension of a single functional device in the dynamic memory array structure.

When a vertical Gate-All-Around (GAA) transistor structure is used as an access transistor of a dynamic memory, its occupied area can reach 4F2 (F is a minimum pattern dimension that can be obtained under given process conditions), and higher density efficiency can be realized in principle. However, since the spacing between adjacent transistors is small, when a semiconductor channel is processed, an insulating layer between the adjacent transistors is easily affected, and the insulating effect of the insulating layer is reduced, thereby affecting the electrical performance of the semiconductor structure.

SUMMARY

Embodiments of the disclosure provide a semiconductor structure and a method for manufacturing the semiconductor structure.

One aspect of the embodiments of the disclosure provides a semiconductor structure, including: a base including bit lines arranged at intervals and semiconductor channels arranged at intervals, the bit lines extending in a first direction, the semiconductor channels being located at a part of top surfaces of the bit lines, each semiconductor channel including a first area, a second area, and a third area arranged successively in a direction perpendicular to the top surfaces of the bit lines; dielectric layers located between adjacent bit lines and located on side walls of the semiconductor channels; gate electrodes surrounding the dielectric layers in the second area and extending in a second direction, the first direction being different from the second direction; metal semiconductor compound layers located on top surfaces of the semiconductor channels; diffusion barrier layers at least surrounding side walls of the metal semiconductor compound layers; and insulating layers located between adjacent semiconductor channels on the same bit line and isolating the gate electrodes and the diffusion barrier layers located on each dielectric layer from the gate electrodes and the diffusion barrier layers located on the dielectric layers adjacent to each dielectric layer.

Another aspect of the embodiments of the disclosure further provides a method for manufacturing a semiconductor structure, which includes the following operations. A base is provided. The base includes bit lines arranged at intervals and initial semiconductor channels arranged at intervals, the bit lines extend in a first direction, the initial semiconductor channels are located at a part of top surfaces of the bit lines, and each initial semiconductor channel includes a first area, a second area, and an initial third area arranged successively in a direction perpendicular to the top surfaces of the bit lines. Dielectric layers are formed. The dielectric layers are located between adjacent bit lines and located on a part of side walls of the initial semiconductor channels. Gate electrodes are formed. The gate electrodes surround the dielectric layers in the second area and extend in a second direction, and the first direction is different from the second direction. Diffusion barrier layers are formed. The diffusion barrier layers surround remaining portion of the side walls of the initial semiconductor channels, and there is a spacing between each of the diffusion barrier layers and a respective one of the gate electrodes. Metal siliconizing treatment is performed on top surfaces of the initial semiconductor channels to transform a part of the initial semiconductor channels in the initial third area into metal semiconductor compound layers, in which remaining portion of the initial third area, the second area, and the third area form semiconductor channels. Insulating layers are formed. The insulating layers are located between adjacent semiconductor channels on the same bit line.

BRIEF DESCRIPTION OF THE DRAWINGS

One or more embodiments are illustrated by the figures in the corresponding accompanying drawings, and these exemplary descriptions do not constitute a limitation to the embodiments. Unless otherwise stated, the figures in the accompanying drawings do not constitute a proportional limitation.

DETAILED DESCRIPTION

It can be known from the Background that the electrical performance of the semiconductor structure at present needs to be improved.

Through analysis, it is found that in order to realize the ohmic contact between the semiconductor channel and other conductive structures, metal elements will be doped only at an end of the semiconductor channel by using relevant technical means, so as to reduce the resistivity of the end of the semiconductor channel and realize the ohmic contact between the end of the semiconductor channel and other conductive structures. However, when adjacent semiconductor channels are electrically insulated from each other through an insulating layer, the metal elements in the semiconductor channels will diffuse into the insulating layer, which reduces the insulating effect of the insulating layer, and increases the parasitic capacitance between adjacent semiconductor channels, thereby reducing the electrical performance of the semiconductor structure.

The embodiments of the disclosure provide a semiconductor structure and a method for manufacturing the semiconductor structure. In the semiconductor structure, in order to realize the ohmic contact between the semiconductor channel and other conductive structures, the top surface of the semiconductor channel is provided with a metal semiconductor compound layer serving as a transition layer to realize the ohmic contact between the top surface of the semiconductor channel and other conductive structures, and to reduce the contact resistance between the top surface of the semiconductor channel and other conductive structures. In addition, a diffusion barrier layer is arranged between the metal semiconductor compound layer and the insulating layer to block the metal semiconductor compound layer from the insulating layer, which is beneficial to prevent metal elements in the metal semiconductor compound layer from diffusing into the insulating layer. Therefore, the embodiments of the disclosure are beneficial to ensure good insulating performance of the insulating layer while reducing the contact resistance between the top surface of the semiconductor channel and other conductive structures through the metal semiconductor compound layer, so as to improve the electrical performance of the semiconductor structure.

Various embodiments of the disclosure will be illustrated in detail below with reference to the accompanying drawings. However, those of ordinary skill in the art can understand that in various embodiments of the disclosure, many technical details have been proposed in order to make a reader better understand the disclosure. However, the technical solutions claimed in the disclosure can also be realized even without these technical details and various changes and modifications based on the following embodiments.

Figure 1:
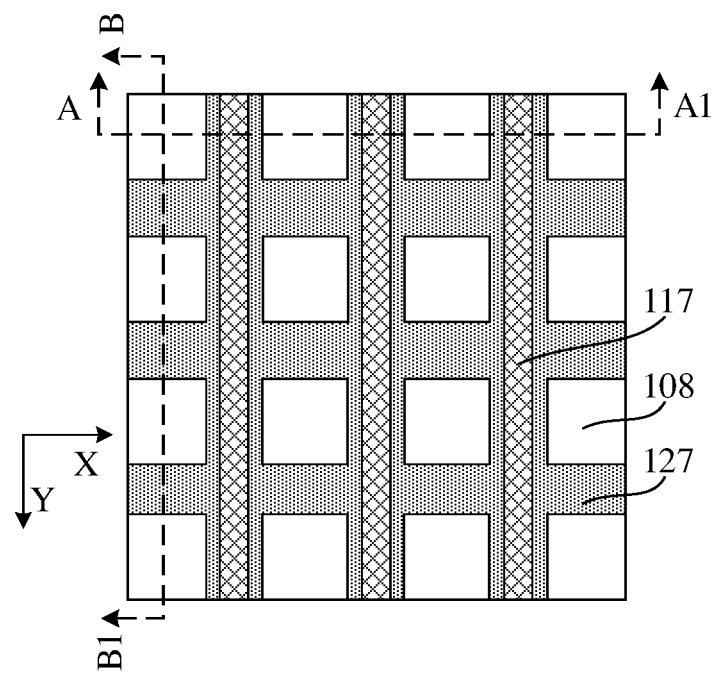
FIG. 1 to FIG. 17 show schematic diagrams of a semiconductor structure corresponding to various operations of a method for manufacturing a semiconductor structure provided by the embodiments of the disclosure.
Figure 2:
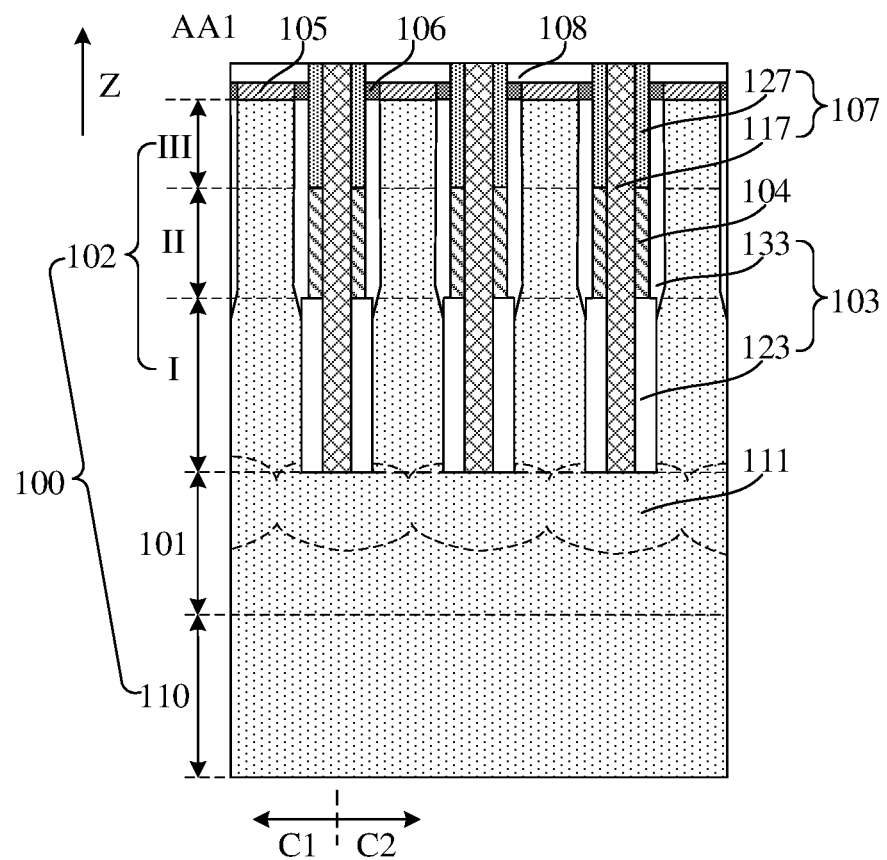
Figure 3:
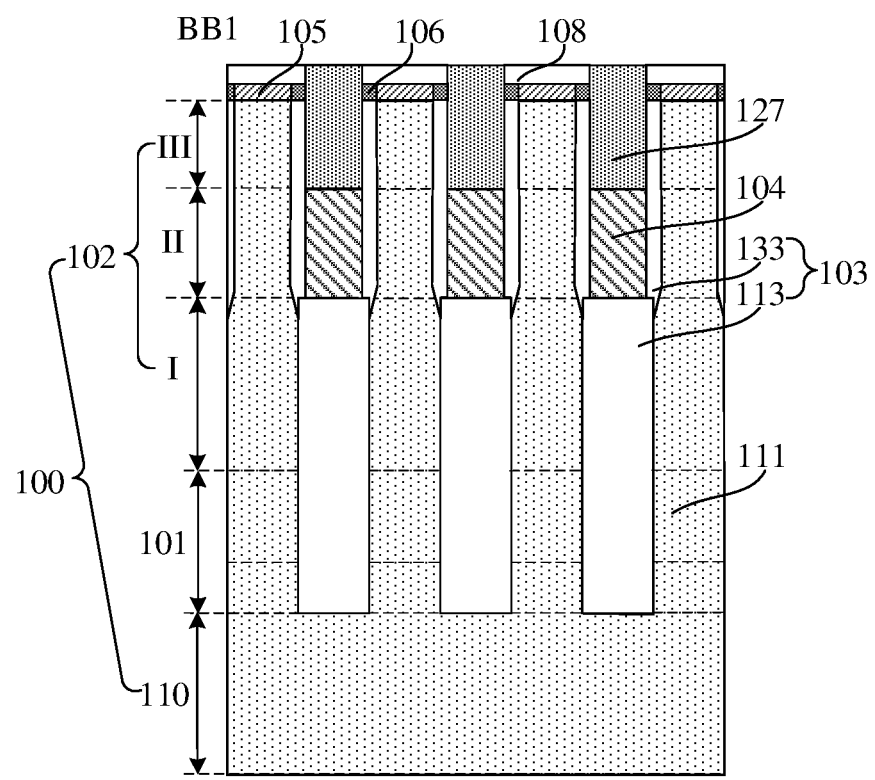
Figure 4:
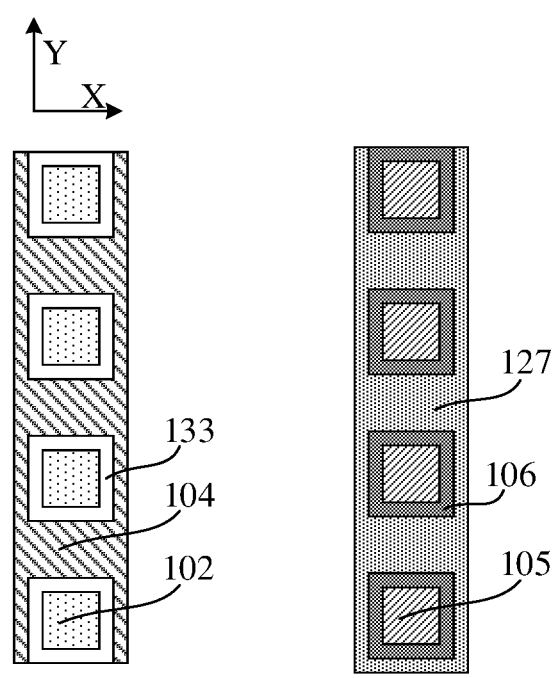

The embodiments of the disclosure provide a semiconductor structure. The semiconductor structure provided by the embodiments of the disclosure will be described in detail below in combination with the accompanying drawings. FIG. 1 to FIG. 3 are diagrams of the semiconductor structure provided by the embodiments of the disclosure. FIG. 1 is a top view of the semiconductor structure provided by the embodiments of the disclosure. FIG. 2 is a schematic cross-sectional view of the semiconductor structure shown in FIG. 1 taken along a first cross-sectional direction AA1. FIG. 3 is a schematic cross-sectional view of the semiconductor structure shown in FIG. 1 taken along a second cross-sectional direction BB1. FIG. 4 is a schematic cross-sectional view of a gate electrode surrounding a semiconductor channel and a diffusion barrier layer surrounding a metal semiconductor compound layer in the semiconductor structure.

With reference to FIG. 1 to FIG. 4, the semiconductor structure includes a base 100, dielectric layers 103, gate electrodes 104, metal semiconductor compound layers 105, diffusion barrier layers 106 and insulating layers 107. The base 100 includes bit lines 101 arranged at intervals and semiconductor channels 102 arranged at intervals. The bit lines 101 extend in a first direction. The semiconductor channels 102 are located at part of top surfaces of the bit lines 101. Each semiconductor channel 102 includes a first area I, a second area II, and a third area III arranged successively in a direction Z perpendicular to the top surfaces of the bit lines 101. The dielectric layers 103 are located between adjacent bit lines 101 and located on side walls of the semiconductor channels 102. The gate electrodes 104 surround the dielectric layers 103 in the second area II and extend in a second direction Y, in which the first direction X is different from the second direction Y. The metal semiconductor compound layers 105 are located on top surfaces of the semiconductor channels 102. The diffusion barrier layers 106 at least surround side walls of the metal semiconductor compound layers 105. The insulating layers 107 are located between the adjacent semiconductor channels 102 on the same bit line 101 and isolate the gate electrodes 104 and the diffusion barrier layers 106 located on each dielectric layer 103 from the gate electrodes 104 and the diffusion barrier layers 106 located on the dielectric layers 103 adjacent to each dielectric layer 103.

The semiconductor channel 102, the dielectric layer 103 surrounding the side wall of the semiconductor channel 102 in the second area II, and the gate electrode 104 form a vertical GAA transistor. The base 100 includes a substrate 110. The bit line 101 is located between the substrate 110 and the GAA transistor, so that a 3D stacked semiconductor structure can be formed, which is beneficial to improve the integration density of the semiconductor structure.

It is to be noted that both the first area I and the third area II can serve as a source electrode or a drain electrode of the GAA transistor. The second area II corresponds to the dielectric layer 103 and the gate electrode 104 of the GAA transistor.

In some embodiments, with reference to FIG. 1, the first direction X is perpendicular to the second direction Y, so that the semiconductor channel 102 is in an arrangement mode of 4F2 (F is the minimum pattern dimension that can be obtained under given process conditions), which is beneficial to improve the integration density of the semiconductor structure. In other embodiments, the first direction intersects with the second direction, and an angle between the first direction and the second direction may not be 90°.

It is to be noted that there are a plurality of bit lines 101 that are arranged at intervals in the base 100. Each bit line 101 may be in contact with at least one first area I. In an example shown in FIG. 1, four bit lines 101 are arranged at intervals and each bit line 101 is in contact with four first areas I. In actual application, the number of the bit lines 101 and the number of the first areas I in contact with each bit line 101 may be reasonably set according to the actual electrical requirements.

The semiconductor structure will be described in more detail below in combination with FIG. 1 to FIG. 3.

In some embodiments, the type of the material of the base 100 may be an element semiconductor material or a crystalline inorganic compound semiconductor material. The element semiconductor material may be silicon or germanium. The crystalline inorganic compound semiconductor material may be silicon carbide, germanium silicon, gallium arsenide, indium gallium, or the like.

In some embodiments, the base 100 includes bit lines 101 and semiconductor channels 102. The base 100, the bit lines 101, and the semiconductor channels 102 have the same semiconductor element. The semiconductor channels 102 and the bit lines 101 may be formed by using the same film structure. The film structure consists of a semiconductor element, so that the semiconductor channels 102 are integrated with the bit lines 101, thereby overcoming an interface state defect between the semiconductor channels 102 and the bit lines 101, and improving the electrical performance of the semiconductor structure.

The semiconductor element may include at least one of silicon, carbon, germanium, arsenic, gallium or indium, which will be illustrated by an example that both the bit lines 101 and the semiconductor channels 102 include silicon.

In some embodiments, the semiconductor structure may further include a metal silicide structure 111, and the metal silicide structure 111 is at least located in the bit lines 101 directly facing bottom surfaces of the insulating layers 107. That is, the metal silicide structure 111 is at least located in the bit lines 101 directly facing a bottom surface of the first insulating layer 117.

The metal silicide structure 111 has relatively low resistivity compared with an unmetallized semiconductor material, thus the resistivity of the bit line 101 including the metal silicide structure 111 is lower compared with the semiconductor channel 102, which is beneficial to reduce the resistance of the bit line 101, reduce the contact resistance between the bit line 101 and the semiconductor channel 102 in the first area I, and further improve the electrical performance of the semiconductor structure. In addition, the resistivity of the bit line 101 is also lower than the resistivity of the substrate 110.

It is to be noted that, in some embodiments, the material of the areas of the bit lines 101 located directly below the first area I may be a semiconductor material, and the material of part areas of the bit lines 101 not covered by the first area I is a metal suicide. It can be understood that with the continuous reduction of the device dimension or the adjustment of manufacturing process parameters, the material of part areas of the bit lines 101 located directly below the first area I is a semiconductor material, and the material of other areas of the bit lines 101 located directly below the first area I may also be metal silicide. The "other areas" here are located at the periphery of "part areas".

For example, with reference to FIG. 2, a plurality of metal silicide structures 111 in the bit line 101 are communicated with each other to form part of the bit line 101, and a part of the metal silicide structure 111 may be located in the bit line 101, and another part of the metal silicide structure 111 may be located in the semiconductor channel 102 in the first area I. In other embodiments, the plurality of metal silicon compound structures in the same bit line may be spaced from each other.

In FIG. 2, the area of the base 100 defined by a dotted box similar to an ellipse is the metal silicide structure 111. In actual application, the size of the contact area between adjacent metal silicide structures 111 is not limited. In other embodiments, the bit line may include the metal silicide structure 111 in full thickness of the bit line.

In some embodiments, with reference to FIG. 2, for a single metal silicide structure 111, the depth of the metal silicide structure 111 gradually increases in the direction from the semiconductor channels 102 located on both sides of the insulating layer 107 to the insulating layer 107, that is, in the directions C1 and C2.

Taking the semiconductor element being silicon as an example, the material of the metal silicide structure 111 includes at least one of cobalt silicide, nickel silicide, molybdenum silicide, titanium silicide, tungsten silicide, tantalum silicide, or platinum silicide.

In some embodiments, the semiconductor channel 102 may have a doping element, which is beneficial to improve the electrical conductivity of the semiconductor channel 102, thereby reducing the break-over voltage between the first area I and the third area III, that is, the break-over voltage between a source electrode and a drain electrode of the GAA transistor. The doping element is a P-type doping element or an N-type doping element. Specifically, the N-type doping element may be at least one of arsenic, phosphorus, or antimony. The P-type doping element may be at least one of boron, indium, or gallium.

In some embodiments, the GAA transistor may be a junction-free transistor, that is, the types of the doping elements in the first area I, the second area II, and the third area II are the same. "Junction-free" refers to that there is no PN junction, that is, the doping concentration of the doping elements in the first area I, the second area II and the third area III is the same. This provides the following advantages. On one hand, there is no need to subjecting the first area I and the third area III with additional doping, so as to avoid the problem that it is difficult to control a doping process of the first area I and the third area III. Especially with further reduction of the transistor dimension, if the first area I and the third area III are subjected with additional doping, it is more difficult to control the doping concentration. On the other hand, the device is a junction-free transistor, which is beneficial to avoid a phenomenon of using an ultra-steep source-drain concentration gradient doping process to manufacture an ultra-steep PN junction in a nano-scale range. Therefore, this can avoid the problems such as threshold voltage drift, leakage current increase, and the like caused by doping mutation, is also beneficial to inhibit a short channel effect, and thus is helpful to further improve the integration density and the electrical performance of the semiconductor structure. It can be understood that the additional doping herein refers to a doping which is performed in such a manner that the types of the doping elements of the first area I and the third area III are different from the types of the doping elements of the second area II.

With reference to FIG. 2 and FIG. 3, in a plane perpendicular to the side walls of the semiconductor channels 102, the cross-sectional area of the semiconductor channel 102 in the first area I is greater than the cross-sectional area of the semiconductor channel 102 in the second area II.

The cross-sectional area of the semiconductor channel 102 in the second area II is smaller than the cross-sectional area of the semiconductor channel 102 in the first area I. The semiconductor channel 102 in the second area II may serve as a channel area of the GAA transistor, which is beneficial to form a channel area with smaller cross-sectional area, is beneficial to improve the control capability of the gate electrode 104 surrounding the side wall of the channel area to the channel area, thereby making it easier to control the turn on or turn off of the GAA transistor.

With reference to FIG. 2 and FIG. 3, each dielectric layer 103 may include a first dielectric layer 113, a second dielectric layer 123 and a third dielectric layer 133. The first dielectric layer 113 is located between the adjacent bit lines 101, and located between the semiconductor channels 102 in the first area I on the adjacent bit lines 101. The second dielectric layer 123 is located on the side walls of the semiconductor channels 102 in the first area I and on a side wall of the first dielectric layer 113 in the first area I. The third dielectric layer 133 surrounds the side walls of the semiconductor channels 102 in the second area II and the third area III.

The first dielectric layer 113 located between the adjacent bit lines 101 is configured to realize electrical insulation between the adjacent bit lines 101. The first dielectric layer 113, the second dielectric layer 123, and the insulating layer 107 located between the semiconductor channels 102 in the first areas I on the adjacent bit lines 101 work together to realize the electrical insulation between the semiconductor channels 102 in the first areas I spaced apart from each other in the first direction X and/or in the second direction Y. The third dielectric layer 133 surrounding the side wall of the semiconductor channel 102 in the second area II may serve as a gate dielectric layer between the subsequently formed gate electrode 104 and the semiconductor channel 102 in the second area II. The third dielectric layer 133 surrounding the side wall of the semiconductor channel 102 in the third area III and the insulating layer 107 work together to realize the electrical insulation between the semiconductor channels 102 in the third areas III spaced apart from each other in the first direction X and/or in the second direction Y.

In some embodiments, the third dielectric layer 133 may also be located on part of the side wall of the second dielectric layer 123, which is beneficial to further ensure the insulation between the gate electrode 104 and the semiconductor channel 102.

In some embodiments, the material of the first dielectric layer 113 is the same as the material of the second dielectric layer 123. Further, both the material of the first dielectric layer 113 and the material of the second dielectric layer 123 may be silicon oxide. In other embodiments, the material of the third dielectric layer 133, the material of the second dielectric layer 123, and the material of the first dielectric layer 113 may be the same. In yet other embodiments, the material of the third dielectric layer 133 may be different from the material of the second dielectric layer 123 and the material of the first dielectric layer 113. The material of the third dielectric layer 133, the material of the second dielectric layer 123 and the material of the first dielectric layer 113 only need to satisfy that the material of the third dielectric layer 133, the material of the second dielectric layer 123 and the material of the first dielectric layer 113 are materials with a good insulation effect.

In some embodiments, with reference to FIG. 4, a single gate electrode 104 extends in the second direction Y, and surrounds the adjacent semiconductor channels 102 on the adjacent bit lines 101, and a single diffusion barrier layer 106 only surrounds a single metal semiconductor compound layer 105. In some embodiments, an orthographic projection of the third dielectric layer 133 on the substrate 110 may overlap with an orthographic projection of the diffusion barrier layer 106 on the substrate 110.

In the second direction Y, a single gate electrode 104 may surround a plurality of semiconductor channels 102. The third dielectric layer 133 is arranged between the gate electrode 104 and each of the plurality of semiconductor channels 102. Adjacent diffusion barrier layers 106 may be spaced apart by a second insulating layer 127.

The material of the gate electrode 104 includes at least one of polysilicon, titanium nitride, tantalum nitride, copper or tungsten, and the material of the diffusion barrier layer 106 may be titanium nitride.

In some embodiments, in a plane perpendicular to the side wall of the semiconductor channel 102, the cross-sectional area of the semiconductor channel 102 in the first area I is greater than the cross-sectional area of the semiconductor channel 102 in the second area II. The dielectric layer 103 includes the first dielectric layer 113, the second dielectric layer 123, and the third dielectric layer 133. Therefore, the gate electrode 104 is at least located on part of the top surface of the first dielectric layer 113 and part of the top surface of the second dielectric layer 123, and the diffusion barrier layer 106 is located on the top surface of the third dielectric layer 133.

The diffusion barrier layer 106 surrounds the side wall of the metal semiconductor compound layer 105, which is beneficial to prevent metal elements in the metal semiconductor compound layer 105 from diffusing into the insulating layer 107, so as to ensure good insulating performance of the insulating layer 107. In addition, the diffusion barrier layer 106 is located at the top surface of the third dielectric layer 133, which can also prevent relevant conductive elements in other conductive structures located on the top surface of the diffusion barrier layer 106 from diffusing into the third dielectric layer 133, to ensure good insulating performance of the third dielectric layer 133.

In some embodiments, an orthographic projection of the diffusion barrier layer 106 on the substrate 110 may cover an orthographic projection of the third dielectric layer 133 on the substrate 110, which is beneficial to more comprehensively prevent relevant conductive elements in other conductive structures on the top surface of the diffusion barrier layer 106 from diffusing into the third dielectric layer 133.

In other embodiments, if the dielectric layer includes a first dielectric layer, a second dielectric layer, and a third dielectric layer, and in a plane perpendicular to the side wall of the semiconductor channel, the cross-sectional area of the semiconductor channel in the first area is equal to the cross-sectional area of the semiconductor channel in the second area, then the third dielectric layer and the gate electrode cover the top surface of the second dielectric layer together.

In addition, the metal semiconductor compound layer 105 has relatively low resistivity compared with an unmetallized semiconductor material, thus the metal semiconductor compound layer 105 has lower resistivity compared with the semiconductor channel 102. If an electrical connection layer 108 is arranged on the top surface of each metal semiconductor compound layer 105, the metal semiconductor compound layer 105 may be used as the transition layer to form ohmic contact between the top surface of the semiconductor channel 102 and the electrical connection layer 108, and the electrical connection layer 108 is prevented from being in direct contact with the semiconductor material to form Schottky barrier contact. The ohmic contact is beneficial to reduce the contact resistance between the top surface of the semiconductor channel 102 and the electrical connection layer 108, so as to reduce the energy consumption of the semiconductor structure during working, improve a Resistance-Capacitance (RC) delay effect, and improve the electrical performance of the semiconductor structure. The material of the metal semiconductor compound layer 105 includes at least one of cobalt silicide, nickel silicide, molybdenum silicide, titanium silicide, tungsten silicide, tantalum silicide, or platinum silicide.

In some embodiments, the metal semiconductor compound layer 105 may have a doping element, and the doping element is a P-type doping element or an N-type doping element. Thus, this is beneficial to further improve the electrical conductivity of the metal semiconductor compound layer 105.

In addition, on the basis that the metal semiconductor compound layer 105 has the doping element, the semiconductor channel 102 may have the doping element with the same type as the doping element of the metal semiconductor compound layer 105, and the concentration of the doping element in the metal semiconductor compound layer 105 is greater than the concentration of the doping element in the semiconductor channel 102. Thus, this is beneficial to further reduce the contact resistance between the metal semiconductor compound layer 105 and the semiconductor channel 102 while improving the electrical conductivity of the semiconductor channel 102.

In some embodiments, the top surfaces of the metal semiconductor compound layers 105 may be flush with the top surfaces of the diffusion barrier layers 106. In the direction Z perpendicular to the top surfaces of the bit lines 101, the length of the metal semiconductor compound layer 105 is less than or equal the length of the diffusion barrier layer 106. Thus, the diffusion barrier layer 106 may at least surround a side wall of the entire metal semiconductor compound layer 105, and increase the total area over which the diffusion barrier layer 106 functions to prevent diffusion, so as to improve the effect of preventing the metal elements in the metal semiconductor compound layer 105 from diffusing into the insulating layer 107. In addition, the length of the diffusion barrier layer 106 is greater than the length of the metal semiconductor compound layer 105, that is, the diffusion barrier layer 106 further surrounds the side wall of part of the semiconductor channel 102, which is beneficial to improve the doping element in the semiconductor channel 102 from diffusing into the insulating layer 107.

In the direction Z perpendicular to the top surface of the bit line 101, the ratio of the length of the metal semiconductor compound layer 105 to the length of the diffusion barrier layer 106 may be 0.8 to 1.2. Thus, this is beneficial to ensure that there is an appropriate spacing between the diffusion barrier layer 106 and the gate electrode 104 and avoid parasitic capacitance between the diffusion barrier layer 106 and the gate electrode 104.

In some embodiments, each insulating layer 107 includes a first insulating layer 117 and a second insulating layer 127. The first insulating layer 117 is located between the dielectric layers 103 of the adjacent semiconductor channels 102 and between the gate electrodes 104, and extends in the second direction Y, and the top surface of the first insulating layer 117 is not lower than the top surface of the metal semiconductor compound layer 105. The second insulating layer 127 is located at the top surface of a respective one of the gate electrodes 104, and located between the first insulating layer 117 and a respective one of the diffusion barrier layers 106.

The first insulating layer 117 and the second insulating layer 127 work together to realize the electrical insulation between the adjacent semiconductor channels 102 and the electrical insulation between the adjacent gate electrodes 104. In addition, the second insulating layer 127 located at the top surface of the gate electrode 104 may realize the electrical insulation between the gate electrode 104 and other conductive structures.

In some embodiments, the semiconductor structure may further include electrical connection layers 108 located at the top surfaces of the metal semiconductor compound layers 105 and the top surfaces of the diffusion barrier layers 106. The insulating layers 107 isolate the adjacent electrical connection layers 108 at the top surfaces of the adjacent semiconductor channels 102 from each other.

The electrical connection layer 108 may be configured to realize electrical connection between the semiconductor channel 102 and a capacitor structure (not shown in the figures).

In conclusion, the metal semiconductor compound layer 105 has relatively low resistivity compared with an unmetallized semiconductor channel 102, which is beneficial to realize ohmic contact between the top surface of the semiconductor channel 102 and other conductive structures, such as the electrical connection layer 108, through the metal semiconductor compound layer 105, and reduce the contact resistance between the top surface of the semiconductor channel 102 and the electrical connection layer 108, so as to improve the electrical performance of the semiconductor channel 102. In addition, the metal semiconductor compound layer 105 is blocked from the insulating layer 107 by the diffusion barrier layer 106, which is beneficial to prevent metal elements in the metal semiconductor compound layer 105 from diffusing into the insulating layer 107 which may result in the reduction of the insulating performance of the insulating layer 107. Therefore, the embodiments of the disclosure are beneficial to ensure good insulating performance of the insulating layer 107 while reducing the contact resistance between the top surface of the semiconductor channel 102 and the electrical connection layer 108 through the metal semiconductor compound layer 105, so as to improve the electrical performance of the semiconductor structure.

Another embodiment of the disclosure further provides a method for manufacturing a semiconductor structure, which can be used to form the semiconductor structure mentioned above.

FIG. 1 to FIG. 17 are schematic cross-sectional views of a semiconductor structure corresponding to various operations of a method for manufacturing a semiconductor structure provided by the embodiments of the disclosure. The method for manufacturing the semiconductor structure provided by the embodiments of the disclosure will be described in detail below in combination with the accompanying drawings. The parts that are the same as or correspond to the embodiments mentioned above will not be elaborated in detail below.

It is to be noted that in order to facilitate description and clearly illustrate the operations of the method for manufacturing the semiconductor structure, FIG. 1 to FIG. 17 in the present embodiment are partial schematic diagrams of the semiconductor structure.

Figure 6:
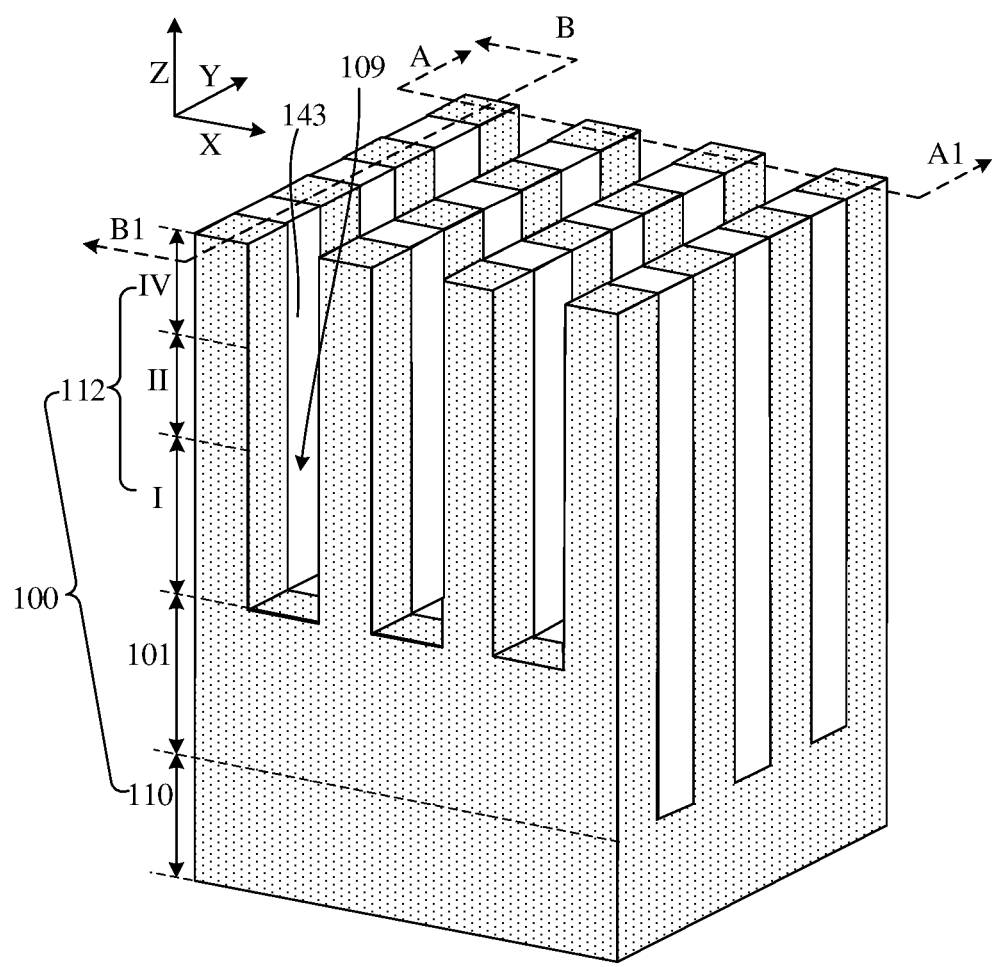
Figure 7A:
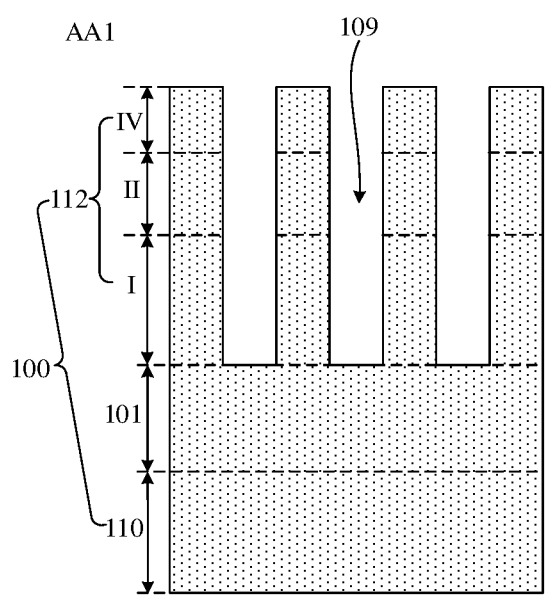
Figure 7B:
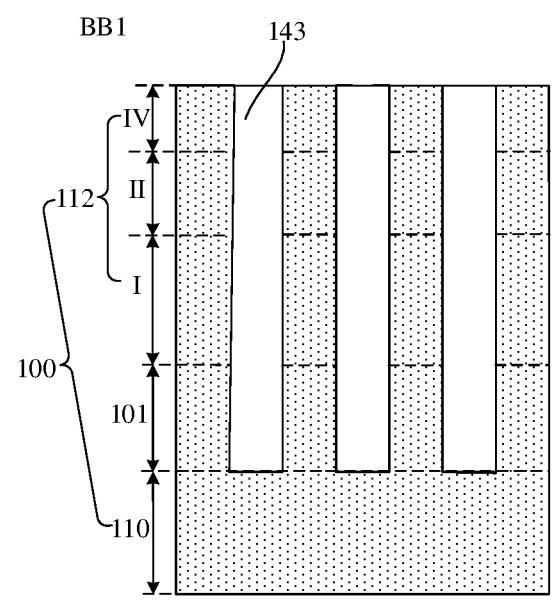

FIG. 7A shows a schematic cross-sectional view of a structure as shown in FIG. 6 taken along a first cross-sectional direction AA1, and FIG. 7B shows a schematic cross-sectional view of a structure as shown in FIG. 6 taken along a second cross-sectional direction BB1. It is to be noted that one or two of the schematic cross-sectional views taken along the first cross-sectional direction AA1 and the second cross-sectional direction BB1 will be set according to the requirement of statement subsequently.

With reference to FIG. 5 to FIG. 7B, a base 100 is provided. The base 100 includes bit lines 101 arranged at intervals and initial semiconductor channels 112 arranged at intervals. The bit lines 101 extend in a first direction X. The initial semiconductor channels 112 are located at part of top surfaces of the bit lines 101. Each initial semiconductor channel 112 includes a first area I, a second area II, and an initial third area IV arranged successively in a direction Z perpendicular to the top surfaces of the bit lines 101. The dielectric layers 103 are formed. The dielectric layers 103 are located between adjacent bit lines 101 and located on part of the side walls of the initial semiconductor channels 112.

It is to be noted that the first area I and the second area II of the initial semiconductor channel 112 are a first area and a second area of subsequent semiconductor channel. The initial third area IV of the initial semiconductor channel 112 prepares for the subsequent formation of a third area of the semiconductor channel and a metal semiconductor compound layer. It can be understood that both the first area I and the subsequently formed third area II may serve as a source electrode or a drain electrode of the subsequently formed GAA transistor with the semiconductor channel, and the second area II corresponds to the dielectric layer and the gate electrode of the subsequently formed GAA transistor.

In some embodiment, the operation that the base 100 is provided may include the following operations.

Figure 5:
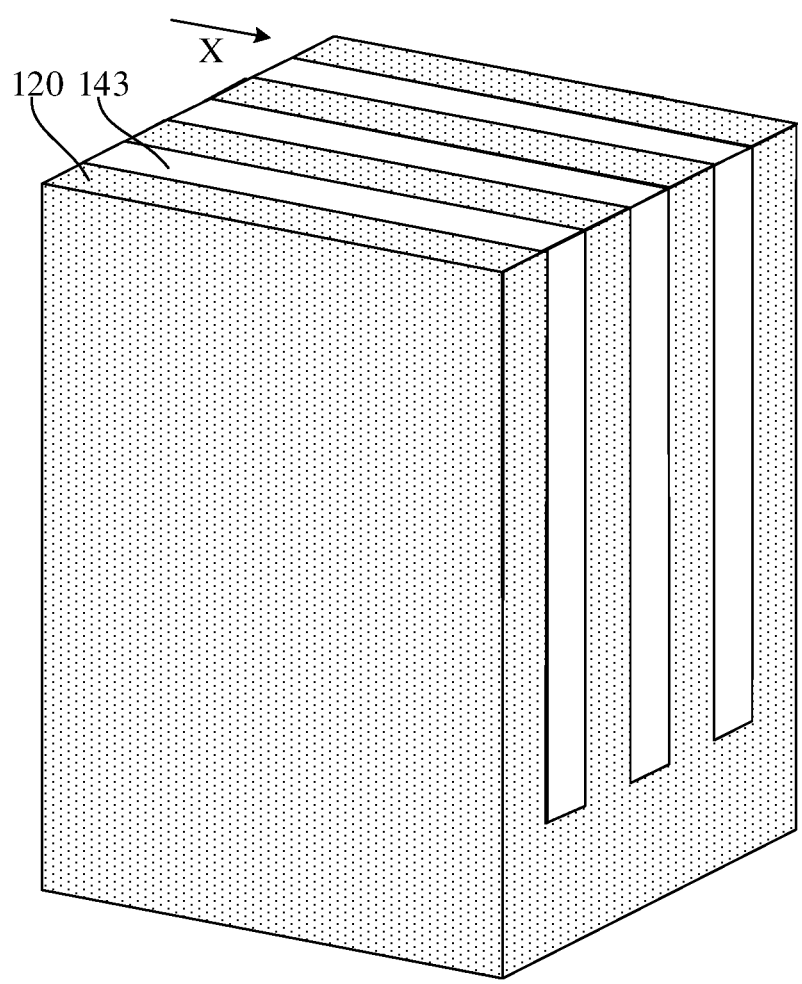

With reference to FIG. 5, an initial base 120 is provided. Initial first dielectric layers 143 extending in the first direction X are arranged in the initial base 120. With reference to FIG. 6 to FIG. 7B, the initial base 120 and the initial first dielectric layers 143 are patterned, to form the bit lines 101 arranged at intervals and the initial semiconductor channels 112 arranged at intervals, and the initial first dielectric layers 143 located between the adjacent bit lines 101. The top surfaces of the initial first dielectric layers 143 are not lower than the top surfaces of the initial semiconductor channels 112. The side walls of the initial semiconductor channels 112, the side walls of the initial first dielectric layers 143, and part of the top surfaces of the bit lines 101 define grooves 109. The grooves 109 extend in the second direction Y.

The type of the material of the initial base 120 may be an element semiconductor material or a crystalline inorganic compound semiconductor material. The element semiconductor material may be silicon or germanium. The crystalline inorganic compound semiconductor material may be silicon carbide, germanium silicon, gallium arsenide, indium gallium, or the like. The initial base 120 is the basis for forming the bit line 101 and the initial semiconductor channel 112. A substrate 110 is also formed while patterning the initial base 120 and the initial first dielectric layer 143 to form the bit line 101 and the initial semiconductor channel 112.

A method for patterning the initial base 120 and the initial first dielectric layer 143 includes Self-Aligned Quadruple Patterning (SAQP) or Self-aligned Double Patterning (SADP).

In some embodiments, the initial base 120 may also be doped and annealed, so that an N-type doping element or a P-type doping element is doped in the initial base 120, which is beneficial to improve the electrical conductivity of the initial semiconductor channel 102 formed by taking the initial base 120 as the basis, thereby reducing the break-over voltage between the first area I and the initial third area III, that is, reducing the break-over voltage between a source electrode and a drain electrode in the subsequently formed GAA transistor. In addition, the N-type doping element or the P-type doping element is doped in the initial base 120, which is beneficial to improve the electrical conductivity of the bit line 101 formed by taking the initial base 120 as the basis, thereby reducing the contact resistance between the first area I and the bit line 101, and improving the electrical performance of the semiconductor structure.

The doping element is a P-type doping element or an N-type doping element. Specifically, the N-type doping element may be at least one of arsenic, phosphorus, or antimony. The P-type doping element may be at least one of boron, indium, or gallium.

With reference to FIG. 8 to FIG. 17, gate electrodes 104 are formed. The gate electrodes 104 surround the dielectric layers 103 in the second area II and extend in the second direction Y, and the first direction X is different from the second direction Y. The diffusion barrier layers 106 are formed. The diffusion barrier layers 106 surround the remaining portion of the side walls of the initial semiconductor channels 112, and there is a spacing between each of the diffusion barrier layers 106 and a respective one of the gate electrodes 104. The metal siliconizing treatment is performed on top surfaces of the initial semiconductor channels 112 to transform part of the initial semiconductor channels 112 in the initial third area IV into metal semiconductor compound layers 105, in which the remaining portion of the initial third area IV, the second area II, and the third area III form the semiconductor channels 102. The insulating layers 107 are formed. The insulating layers 107 are located between adjacent semiconductor channels 102 on the same bit line 101.

In some embodiments, the operation that the metal semiconductor compound layer 105 is formed through the metal siliconizing treatment may include the following operation. A first metal layer (not shown in the figures) is formed on the top surface of the initial semiconductor channel 112, in which the first metal layer provides metal elements for the metal semiconductor compound layer 105. The material of the first metal layer includes at least one of cobalt, nickel, molybdenum, titanium, tungsten, tantalum, or platinum.

In some embodiments, when the side wall of the initial semiconductor channel 112, the side wall of the initial first dielectric layer 143, and part of the top surface of the bit line 101 define the groove 109, the operation that the dielectric layer 103, the gate electrode 104, the diffusion barrier layer 106, and the insulating layer 107 are formed may include the following operations.

With reference to FIG. 8, FIG. 9, FIG. 10A and FIG. 10B, a first dielectric layer 113 is formed between the adjacent bit lines 101 and between the semiconductor channels 102 in the first area I on the adjacent bit lines 101. A second dielectric layer 123 is formed on side walls of the grooves 109 in the first area I. A first insulating layer 117 is formed. The first insulating layer 117 is located in the groove 109 and isolates the adjacent second dielectric layers 123 from each other. The top surface of the first insulating layer 117 is not lower than the top surface of the initial semiconductor channel 112.

The top surface of the first insulating layer 117 is not lower than the top surface of the initial semiconductor channel 112, which is beneficial to form a second spacing between the first insulating layer 117 and the semiconductor channels 102 in the second area II and the third area III. Then, a gate electrode with an accurate dimension may be formed in the second spacing in a self-aligned manner. The gate electrode with high dimension accuracy can be formed without an etching process, which is beneficial to simplify the operation of forming the gate electrode, and a small-dimension gate electrode can be obtained by regulating and controlling the dimension of the second spacing.

In some embodiments, the operation that the first dielectric layer 113, the second dielectric layer 123, and the first insulating layer 117 are formed may include the following operations.

Figure 8:
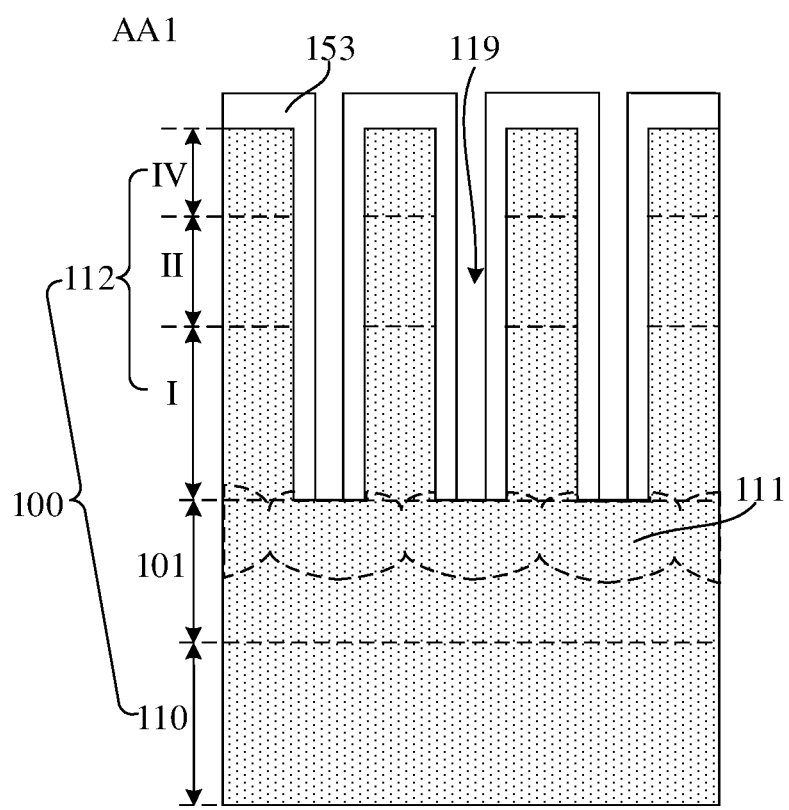

With reference to FIG. 8, initial second dielectric layers 153 are formed on the side walls of the grooves 109 (with reference to FIG. 7A), and there is a first spacing 119 between adjacent initial second dielectric layers 153. In some embodiments, the initial second dielectric layers 153 may be formed by using the following process operation. A deposition process is performed to form a surface that covers the top surfaces and all the exposed side walls of the semiconductor channels 102, and covers the exposed top surfaces and the side walls of the initial first dielectric layers 143. The material of the initial second dielectric layer 153 includes silicon oxide.

Figure 9:
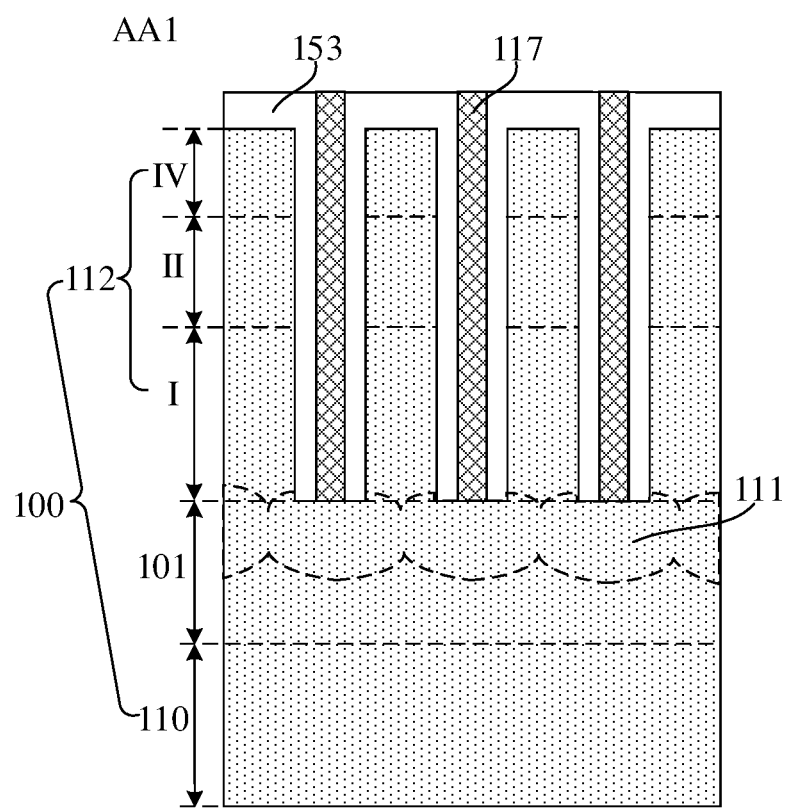

With reference to FIG. 8 and FIG. 9, the first insulating layer 117 is formed in the first spacing 119. In some embodiments, the first insulating layer 117 may be formed by using the following process operations. A first insulating film that covers the top surface of the initial second dielectric layer 153 and fills the first spacing 119 is formed. The chemical mechanical flattening treatment is performed on the first insulating film until the initial second dielectric layer 153 is exposed, in which the remaining portion of the first insulating film forms the first insulating layer 117. The material of the first insulating layer 117 includes silicon nitride.

The material of the initial first dielectric layer 143 and the material of the initial second dielectric layer 153 are the same, which is beneficial to remove part of the initial first dielectric layer 143 and part of the initial second dielectric layer 153 through the same removal operation, so as to form a second spacing.

In some embodiments, with reference to FIG. 8, the metal siliconizing treatment is performed on part of the top surface of the bit line 101 exposed by the initial second dielectric layer 153 to form a metal silicide structure 111 before the first insulating layer 117 is formed and after the initial second dielectric layer 153 is formed.

The metal silicide structure 111 has relatively low resistivity compared with an unmetallized semiconductor material, thus the resistivity of the bit line 101 including the metal silicide structure 111 is lower compared with the semiconductor channel 102, which is beneficial to reduce the resistance of the bit line 101, reduce the contact resistance between the bit line 101 and the semiconductor channel 102 in the first area I, and further improve the electrical performance of the semiconductor structure.

In some embodiments, the operation that the metal siliconizing treatment is performed on part of the top surface of the bit line 101 exposed by the initial second dielectric layer 153 may include the following operation. A second metal layer (not shown in the figures) is formed on the exposed top surface of the bit line 101, in which the second metal layer provides metal elements for the metal silicide structure 111. The material of the second metal layer includes at least one of cobalt, nickel, molybdenum, titanium, tungsten, tantalum or platinum.

In other embodiments, the metal siliconizing treatment may also not be performed on the exposed top surface of the bit line, and the first insulating layer may be directly formed on the exposed top surface of the bit line.

Figure 10A:
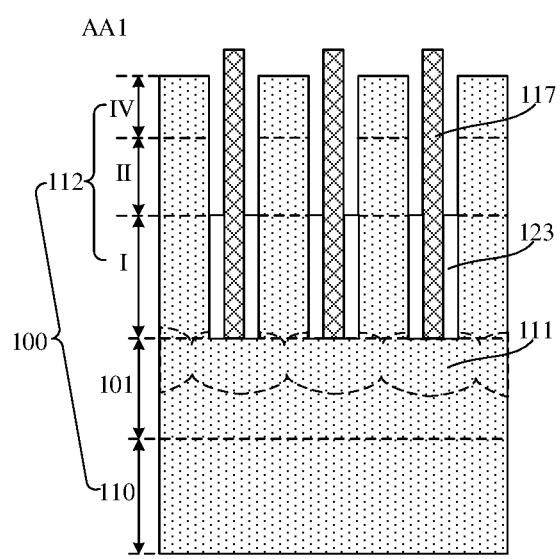
Figure 10B:
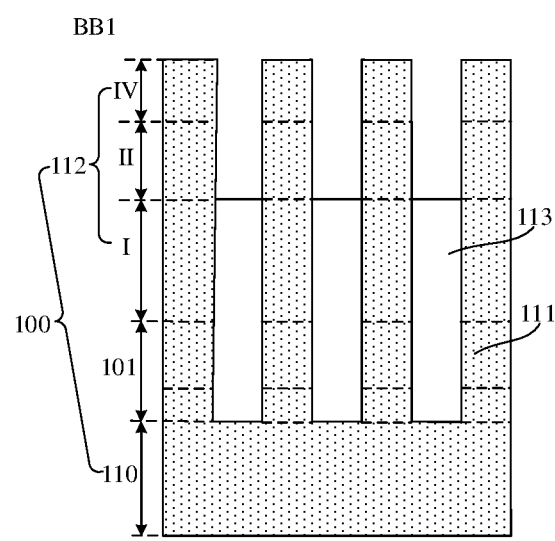

Then, with reference to FIG. 10A and FIG. 10B, the initial first dielectric layer 143 and the initial second dielectric layer 153 are etched by taking the first insulating layer 117 as a mask, to form the first dielectric layer 113 and the second dielectric layer 123.

In the operation that the initial first dielectric layer 143 and the initial second dielectric layer 153 are etched, the top surface of the semiconductor channel 102 is further exposed, which facilitates subsequent metal siliconizing treatment on the top surface of the semiconductor channel 102 to form the metal semiconductor compound layer.

With reference to FIG. 11 to FIG. 17, a third dielectric layer 133 and a second insulating layer 127 are formed. The third dielectric layer 133 is located on the side walls of the grooves 109 in the second area II and part of the side walls of the grooves 109 in the initial third area IV. The second insulating layer 127 is located between the first insulating layer 117 and the third dielectric layer 133. The diffusion barrier layers 106 are formed in the remaining portion of the side walls of the grooves 109 in the initial third area IV. The first dielectric layer 113, the second dielectric layer 123, and the third dielectric layer 133 form the dielectric layers 103. The first insulating layer 117 and the second insulating layer 127 form insulating layers 107.

In some embodiments, the operation that the third dielectric layer 133, the gate electrode 104, and second insulating layer 127 are formed may include the following operations.

Figure 11:
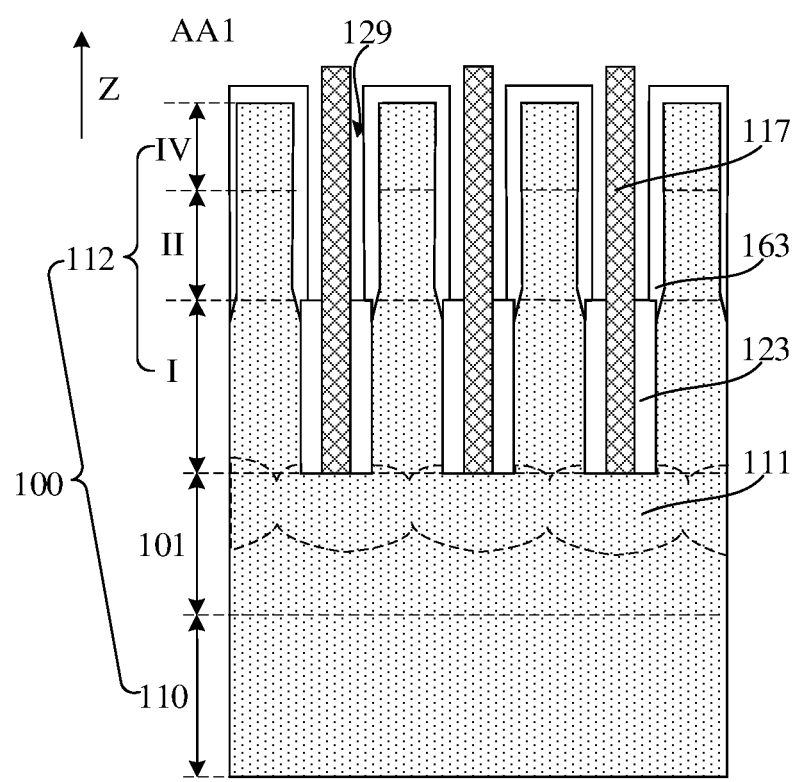

With reference to FIG. 11, an initial third dielectric layer 163 is formed on the side walls of the initial semiconductor channels 112 in the second area II and the initial third area IV, and there is a second spacing 129 between the initial third dielectric layer 163 and the first insulating layer 117. In some embodiments, the initial third dielectric layer 163 may be formed by using the following process operations. The thermal oxidation treatment is performed on the exposed surfaces of the initial semiconductor channels 112 in the second area II and the initial third area IV, to form an initial third dielectric layer 163. The material of the initial third dielectric layer 163 is silicon oxide. In other embodiments, the initial third dielectric layer that covers the surfaces of the initial semiconductor channels in the second area and the initial third area may also be formed through a deposition process.

Figure 12:
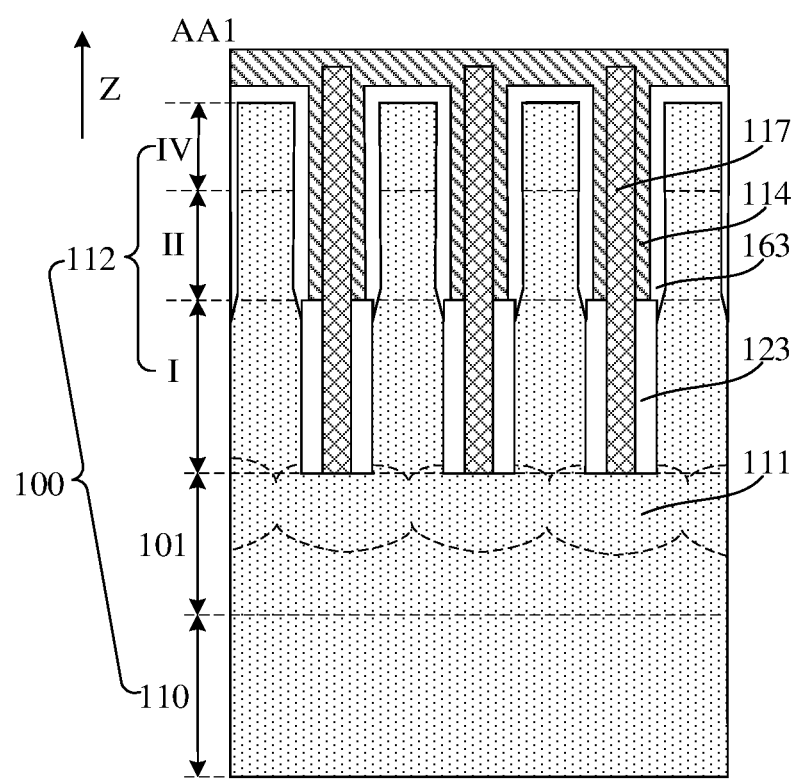
Figure 13A:
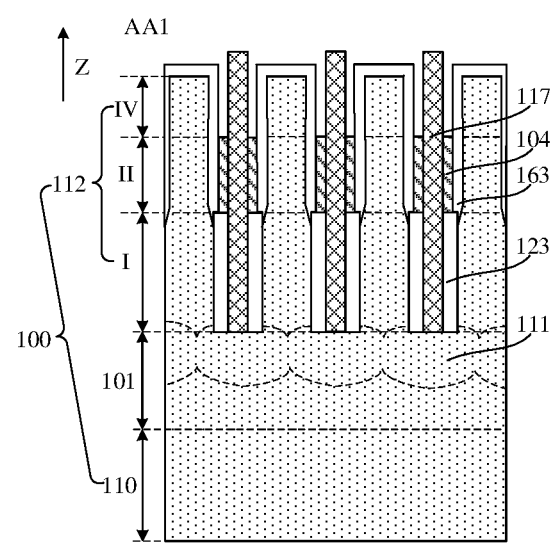
Figure 13B:
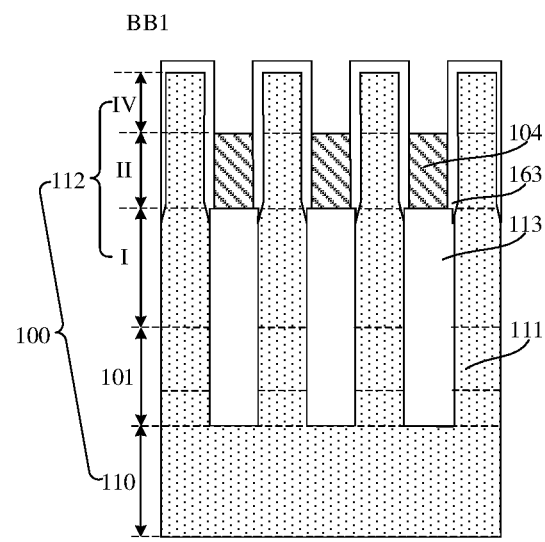

With reference to FIG. 12, FIG. 13A and FIG. 13B, the gate electrode 104 is formed in the second spacing 129 (with reference to FIG. 11) in the second area II. The operation that the gate electrode 104 is formed may include the following operations. With reference to FIG. 12, an initial gate electrode 114 is formed, in which the initial gate electrode 114 fills the second spacing 129 and is located on the top surface of the initial third dielectric layer 163. With reference to FIG. 13A and FIG. 13B, the initial gate electrode 114 which surrounds the side wall of the semiconductor channel 102 in the initial third area IV and which is located on the top surface of the initial third dielectric layer 163 is removed by etching, in which the remaining portion of the initial gate electrode 114 forms the gate electrode 104, and the gate electrode 104 only surrounds the side wall of the semiconductor channel 102 in the second area II.

Figure 14A:
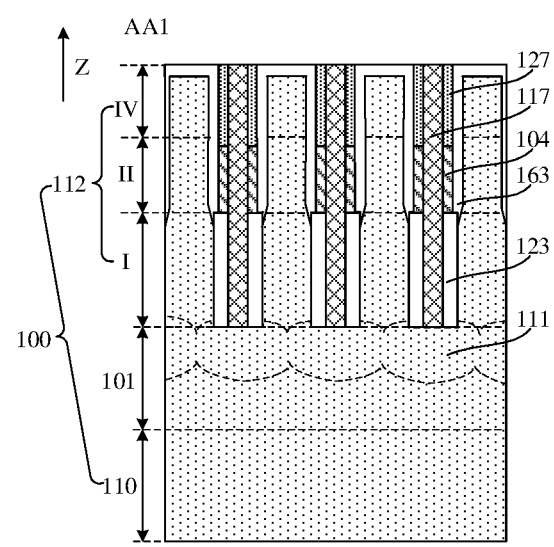
Figure 14B:
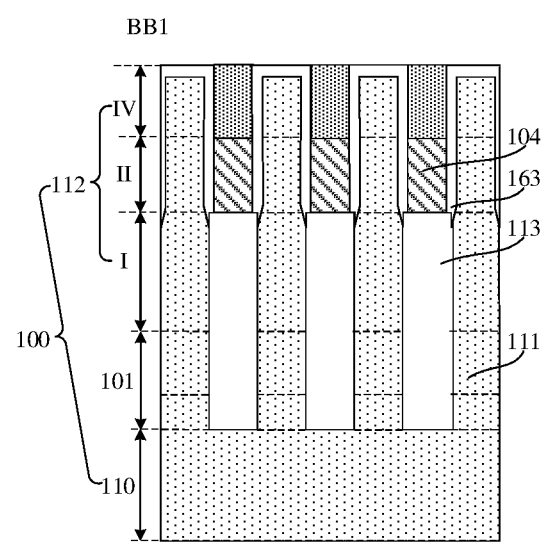

With reference to FIG. 14A and FIG. 14B, the second insulating layer 127 is formed in the remaining portion of the second spacing 129. In some embodiments, the second insulating layer 127 may be formed by using the following process operations. A deposition process is performed to form a second insulating film that fills the remaining portion of the second spacing 129 (with reference to FIG. 11) and covers the top surface of the initial third dielectric layer 163. The chemical mechanical grinding is performed on the second insulating film and the first insulating layer 117 until the initial third dielectric layer 163 is exposed, in which the remaining portion of the second insulating film forms the second insulating layer 127. The material of the second insulating film includes silicon nitride.

Figure 15:
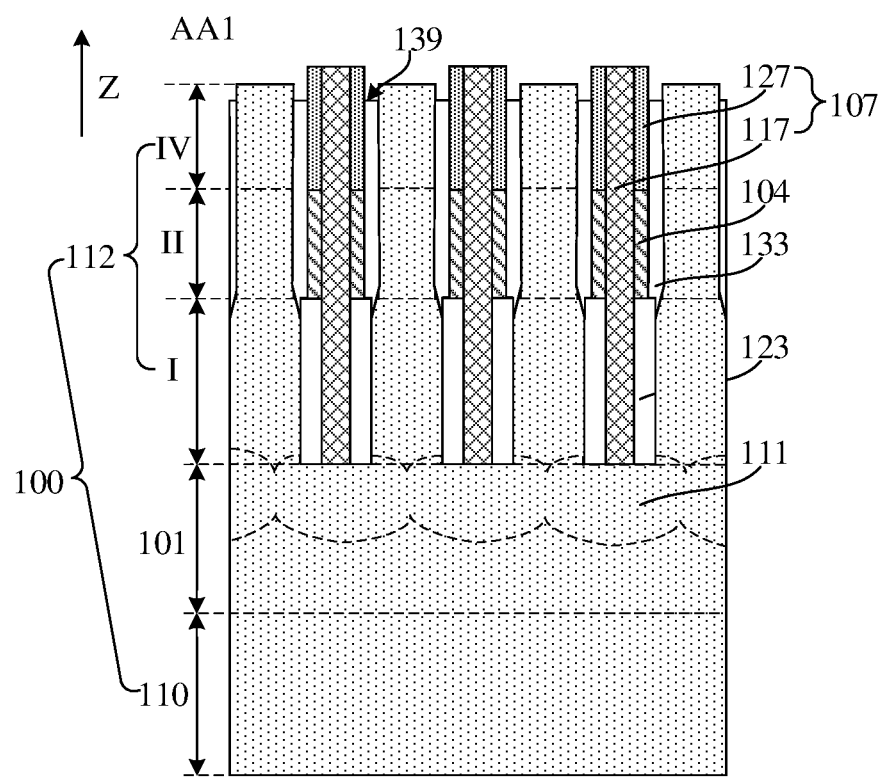

With reference to FIG. 15, the initial third dielectric layer 163 is etched by taking the second insulating layer 127 as a mask, to form the third dielectric layer 133.

In the operation that the third dielectric layer 133 is formed, not only the top surface of the initial semiconductor channel 112 is exposed, but also part of the side wall, close to the top surface, of the initial semiconductor channel 112 in the initial third area IV is also exposed, which prepares for subsequent formation of the diffusion barrier layer.

Figure 16:
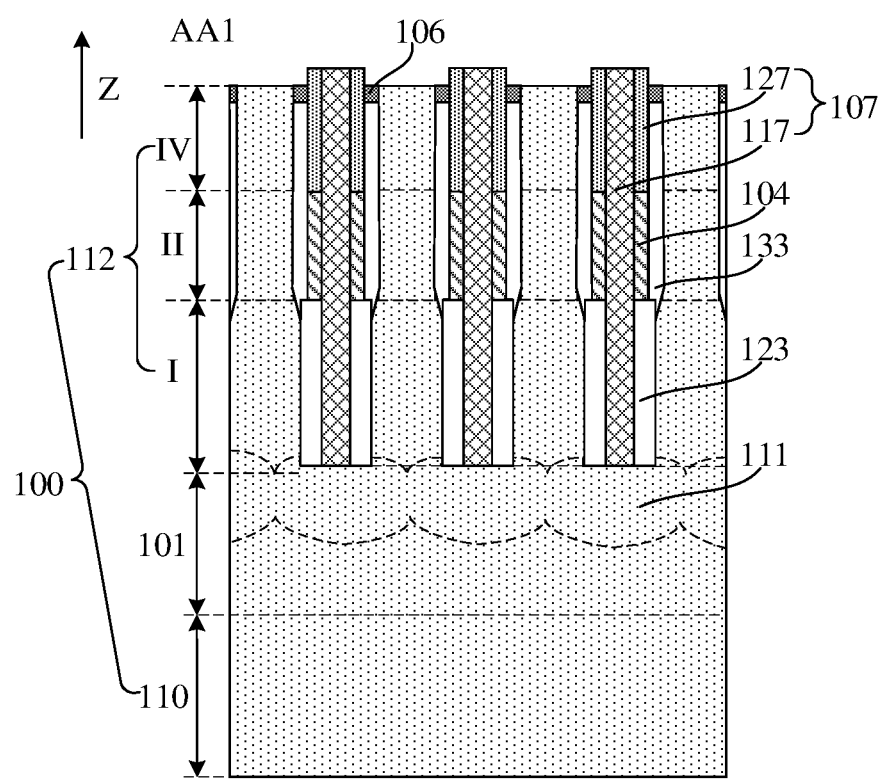

With reference to FIG. 15 and FIG. 16, the third dielectric layer 133, the second insulating layer 127, and the initial semiconductor channel 112 define grooves 139, and diffusion barrier layers 106 filling the grooves 139 are formed. In some embodiments, the diffusion barrier layer 106 may be formed by using the following process operations. A barrier film that covers the top surface of the initial semiconductor channel 112 and fills the groove 139 is formed. The barrier film is etched until part of a side wall, close to the top surface, of the initial semiconductor channel 112 in the initial third area IV is exposed, in which the remaining portion of the barrier film forms the diffusion barrier layer 106. The material of the diffusion barrier layer 106 includes titanium nitride.

The diffusion barrier layer 106 is beneficial to prevent metal elements in the metal semiconductor compound layer 105 from diffusing into the insulating layer 107, to ensure good insulating performance of the insulating layer 107. In addition, the diffusion barrier layer 106 is located at the top surface of the third dielectric layer 133, which can also prevent relevant conductive elements in other conductive structures located on the top surface of the diffusion barrier layer 106 from diffusing into the third dielectric layer 133, to ensure good insulating performance of the third dielectric layer 133.

Figure 17:
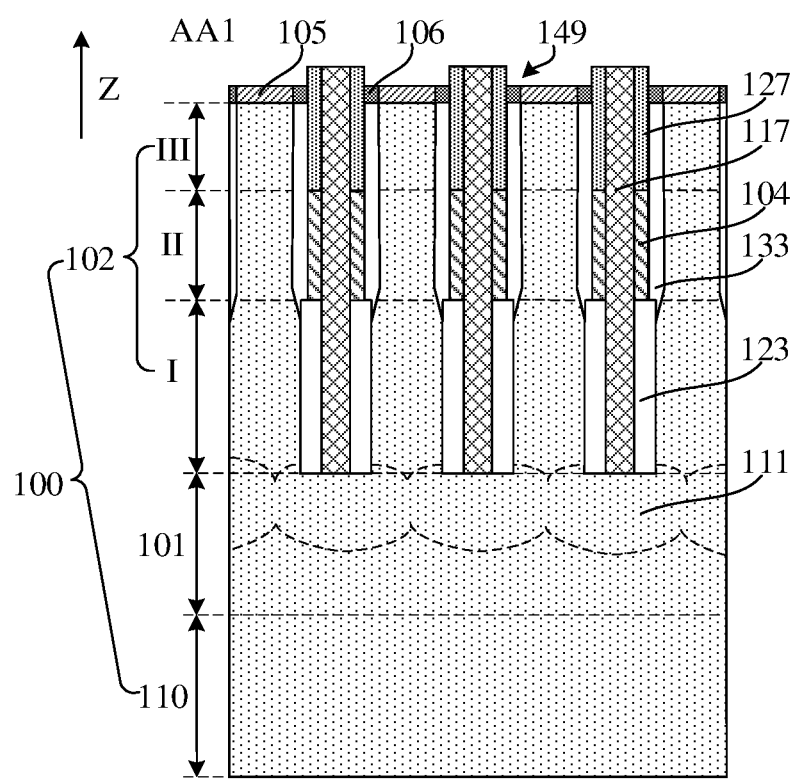

Then, with reference to FIG. 16 and FIG. 17, the metal siliconizing treatment is performed on the top surfaces of the initial semiconductor channels 112, to transform part of the initial semiconductor channels 112 in the initial third area IV into the metal semiconductor compound layers 105. The remaining portion of the initial third area IV, the second area II, and the third area III form the semiconductor channels 102.

The metal semiconductor compound layer 105 has lower resistivity compared with the semiconductor channel 102. An electrical connection layer is formed on the top surface of the metal semiconductor compound layer 105, which is beneficial to take the metal semiconductor compound layer 105 as a transition layer to form ohmic contact between the top surface of the semiconductor channel 102 and the electrical connection layer, and prevent the electrical connection layer from being in direct contact with the semiconductor channel 102 to form Schottky barrier contact. The ohmic contact is beneficial to reduce the contact resistance between the top surface of the semiconductor channel 102 and the electrical connection layer, reduce the energy consumption of the semiconductor structure during working, improve the RC delay effect, and improve the electrical performance of the semiconductor structure.

In some embodiments, after the diffusion barrier layers 106 are formed and before the metal semiconductor compound layers 105 are formed, the method may further includes the following operation. The top surface of the initial semiconductor channel 112 is doped, so that part of the initial semiconductor channels 112 in the initial third area IV has a doping element, in which the doping element is a P-type doping element or an N-type doping element.

In addition, the semiconductor channel 102 may have the doping element with the same type as the doping element in the metal semiconductor compound layer 105, and the concentration of the doping element in the metal semiconductor compound layer 105 is greater than the concentration of the doping element in the semiconductor channel 102. Thus, this is beneficial to further reduce the contact resistance between the metal semiconductor compound layer 105 and the semiconductor channel 102 while improving the electrical conductivity of the semiconductor channel 102.

In some embodiments, with reference to FIG. 17 and FIG. 2 to FIG. 3, the top surface of the insulating layer 107 is higher than the top surface of the metal semiconductor compound layer 105. The insulating layer 107, the metal semiconductor compound layer 105, and the diffusion barrier layer 106 define a through hole 149. The method may further include the following operation. An electrical connection layer 108 that fills the through hole 149 is formed. The electrical connection layer 108 may be configured to realize electrical connection between the semiconductor channel 102 and a capacitor structure (not shown in the figures).

In conclusion, a second spacing 129 is formed between the first insulating layer 117 and the semiconductor channels 102 in the second area II and the third area III, which is beneficial to form a gate electrode 104 with an accurate dimension in the second spacing 129 in a self-aligned manner. The gate electrode 104 with high dimension accuracy can be formed without an etching process, which is beneficial to simplify the operation of forming the gate electrode 104, and a small-dimension gate electrode 104 can be obtained by regulating and controlling the dimension of the second spacing 129. In addition, the metal semiconductor compound layer 105 serving as a transition layer is formed on the top surface of the semiconductor channel 102, to realize ohmic contact between the top surface of the semiconductor channel 102 and the electrical connection layer 108, and reduce the contact resistance between the top surface of the semiconductor channel 102 and the electrical connection layer 108. Moreover, the diffusion barrier layer 106 is formed between the metal semiconductor compound layer 105 and the insulating layer 107 to block the metal semiconductor compound layer 105 from the insulating layer 107, which is beneficial to prevent the metal elements in the metal semiconductor compound layer 105 from diffusing into the insulating layer 107, thereby ensuring good insulating performance of the insulating layer 107 while reducing the contact resistance between the top surface of the semiconductor channel 102 and the electrical connection layer 108 through the metal semiconductor compound layer 105, and improving the electrical performance of the semiconductor structure.

Those skilled in the art can understand that the above embodiments are specific embodiments to implement the disclosure. In practical application, various changes can be made in forms and details without departing from the spirit and scope of the disclosure. Any person skilled in the art may make various changes and modifications without departing from the spirit and scope of the disclosure. Therefore, the scope of protection of the disclosure shall be subject to the scope defined in the claims.

The invention claimed is:

1. A semiconductor structure, comprising:
   a base comprising bit lines arranged at intervals and semiconductor channels arranged at intervals, the bit lines extending in a first direction, the semiconductor channels being located on a part of top surfaces of the bit lines, each semiconductor channel comprising a first area, a second area, and a third area arranged successively in a direction perpendicular to the top surfaces of the bit lines;
   dielectric layers located between adjacent bit lines and located on side walls of the semiconductor channels, wherein each of the dielectric layers comprises a third dielectric layer surrounding the side walls of the semiconductor channels in the second area and the third area;
   gate electrodes surrounding the dielectric layers in the second area and extending in a second direction, the first direction being different from the second direction;
   metal semiconductor compound layers located on top surfaces of the semiconductor channels;
   diffusion barrier layers at least surrounding side walls of the metal semiconductor compound layers, wherein each of the diffusion barrier layers is located at the top surface of the third dielectric layer; and
   insulating layers located between adjacent semiconductor channels on the same bit line and isolating the gate electrodes and the diffusion barrier layers located on each dielectric layer from the gate electrodes and the diffusion barrier layers located on the dielectric layers adjacent to each dielectric layer.

2. The semiconductor structure according to claim 1, wherein the metal semiconductor compound layers have a doping element, and the doping element is a P-type doping element or an N-type doping element.

3. The semiconductor structure according to claim 2, wherein
the semiconductor channels have a doping element, and a concentration of the doping element in the metal semiconductor compound layers is greater than a concentration of the doping element in the semiconductor channels.

4. The semiconductor structure according to claim 1, wherein
top surfaces of the metal semiconductor compound layers are flush with top surfaces of the diffusion barrier layers, and in the direction perpendicular to the top surfaces of the bit lines, a length of each of the metal semiconductor compound layers is less than or equal to a length of each of the diffusion barrier layers.

5. The semiconductor structure according to claim 1, further comprising
electrical connection layers located on top surfaces of the metal semiconductor compound layers and top surface of the diffusion barrier layers, wherein the insulating layers isolate adjacent electrical connection layers located on the top surfaces of the adjacent semiconductor channels from each other.

6. The semiconductor structure according to claim 1, wherein
a single gate electrode of the gate electrodes extends in the second direction, and surrounds the adjacent semiconductor channels on the adjacent bit lines;
and a single diffusion barrier layer of the diffusion barrier layers only surrounds a single metal semiconductor compound layer of the metal semiconductor compound layers.

7. The semiconductor structure according to claim 1, further comprising
a metal silicide structure at least located in the bit lines directly facing bottom surfaces of the insulating layers.

8. The semiconductor structure according to claim 7, wherein
a depth of the metal silicide structure gradually increases in a direction from the semiconductor channels located on both sides of the insulating layers to the insulating layers.

9. The semiconductor structure according to claim 1, wherein
in a plane perpendicular to the side walls of the semiconductor channels, a cross-sectional area of each of the semiconductor channels in the first area is greater than a cross-sectional area of each of the semiconductor channels in the second area.

10. The semiconductor structure according to claim 1, wherein
each of the dielectric layers comprises:
a first dielectric layer located between the adjacent bit lines and located between the semiconductor channels in the first area on the adjacent bit lines; and
a second dielectric layer located on the side walls of the semiconductor channels in the first area and on a side wall of the first dielectric layer in the first area.

11. The semiconductor structure according to claim 10, wherein
each of the gate electrodes is at least located on a part of a top surface of the first dielectric layer and a part of a top surface of the second dielectric layer, and each of the diffusion barrier layers is located on a top surface of the third dielectric layer.

12. The semiconductor structure according to claim 1, wherein
each of the insulating layers comprises:
a first insulating layer located between the dielectric layers of the adjacent semiconductor channels and between the gate electrodes and extending in the second direction, wherein a top surface of the first insulating layer is not lower than a top surface of each of the metal semiconductor compound layers; and
a second insulating layer located on a top surface of a respective one of the gate electrodes and located between the first insulating layer and a respective one of the diffusion barrier layers.

13. A method for manufacturing a semiconductor structure, comprising:
providing a base, wherein the base comprises bit lines arranged at intervals and initial semiconductor channels arranged at intervals, the bit lines extend in a first direction, the initial semiconductor channels are located on a part of top surfaces of the bit lines, and each initial semiconductor channel comprises a first area, a second area, and an initial third area arranged successively in a direction perpendicular to the top surfaces of the bit lines;
forming dielectric layers, wherein the dielectric layers are located between adjacent bit lines and located on a part of side walls of the initial semiconductor channels, wherein each of the dielectric layers comprises a third dielectric layer surrounding the side walls of the semiconductor channels in the second area and the third area;
forming gate electrodes, wherein the gate electrodes surround the dielectric layers in the second area and extend in a second direction, and the first direction is different from the second direction;
forming diffusion barrier layers, wherein the diffusion barrier layers surround remaining portion of the side walls of the initial semiconductor channels, each of the diffusion barrier layers is located at the top surface of the third dielectric layer, and there is a spacing between each of the diffusion barrier layers and a respective one of the gate electrodes;
performing metal siliconizing treatment on top surfaces of the initial semiconductor channels to transform a part of the initial semiconductor channels in the initial third area into metal semiconductor compound layers, wherein remaining portion of the initial third area, the second area, and the third area form semiconductor channels; and
forming insulating layers, wherein the insulating layers are located between adjacent semiconductor channels on the same bit line.

14. The method according to claim 13, wherein
after forming the diffusion barrier layers and before forming the metal semiconductor compound layers, the method further comprises: doping the top surfaces of the initial semiconductor channels, so that a part of the initial semiconductor channels in the initial third area has a doping element, wherein the doping element is a P-type doping element or an N-type doping element.

15. The method according to claim 13, wherein
providing the base comprises:

providing an initial base, wherein initial first dielectric layers extending in the first direction are arranged in the initial base; and patterning the initial base and the initial first dielectric layers, to form the bit lines arranged at intervals and the initial semiconductor channels arranged at intervals, and the initial first dielectric layers located between the adjacent bit lines, wherein top surfaces of the initial first dielectric layers are not lower than the top surfaces of the initial semiconductor channels, and the side walls of the initial semiconductor channels, side walls of the initial first dielectric layers, and a part of the top surfaces of the bit lines define grooves extending in the second direction.

16. The method according to claim 15, wherein forming the dielectric layers, the gate electrodes, the diffusion barrier layers, and the insulating layers comprises:

forming a first dielectric layer between the adjacent bit lines and between the semiconductor channels in the first area on the adjacent bit lines;

forming a second dielectric layer on side walls of the grooves in the first area;

forming a first insulating layer, wherein the first insulating layer is located in the grooves and isolates adjacent second dielectric layers from each other, and a top surface of the first insulating layer is not lower than the top surfaces of the initial semiconductor channels;

forming the third dielectric layer and a second insulating layer, wherein the third dielectric layer is located on the side walls of the grooves in the second area and a part of the side walls of the grooves in the initial third area, and the second insulating layer is located between the first insulating layer and the third dielectric layer; and forming the diffusion barrier layers on remaining portion of the side walls of the grooves in the initial third area, wherein the first dielectric layer, the second dielectric layer, and the third dielectric layer form the dielectric layers, and the first insulating layer and the second insulating layer form the insulating layers.

17. The method according to claim 16, wherein forming the first dielectric layer, the second dielectric layer, and the first insulating layer comprises:

forming initial second dielectric layers on the side walls of the grooves, wherein there is a first spacing between adjacent initial second dielectric layers;

forming the first insulating layer in the first spacing; and etching the initial first dielectric layers and the initial second dielectric layers by taking the first insulating layer as a mask, to form the first dielectric layer and the second dielectric layer.

18. The method according to claim 17, wherein before forming the first insulating layer and after forming the initial second dielectric layers, the method comprises: performing metal siliconizing treatment on a part of the top surfaces of the bit lines exposed by the initial second dielectric layers, to form a metal silicide structure.

19. The method according to claim 16, wherein forming the third dielectric layer, the gate electrodes, and the second insulating layer comprises:

forming an initial third dielectric layer on the side walls of the initial semiconductor channels in the second area and the initial third area, wherein there is a second spacing between the initial third dielectric layer and the first insulating layer;

forming the gate electrodes in the second spacing in the second area;

forming the second insulating layer in remaining portion of the second spacing; and etching the initial third dielectric layer by taking the second insulating layer as a mask, to form the third dielectric layer, wherein the third dielectric layer, the second insulating layer, and the initial semiconductor channels define the grooves; and forming the diffusion barrier layers filling the grooves.

20. The method according to claim 13, wherein the top surfaces of the insulating layers are higher than top surfaces of the metal semiconductor compound layers, the insulating layers, the metal semiconductor compound layers, and the diffusion barrier layers define through holes, and the method further comprises: forming electrical connection layers filling the through holes.

* * * * *